(12) United States Patent
Tsironis

(10) Patent No.: US 9,899,984 B1
(45) Date of Patent: Feb. 20, 2018

(54) COMPACT MULTI-CARRIAGE IMPEDANCE TUNER AND METHOD

(71) Applicant: Christos Tsironis, Dollard-des-Ormeaux (CA)

(72) Inventor: Christos Tsironis, Kirkland (CA)

(*) Notice: Subject to any disclaimer, the term of this patent is extended or adjusted under 35 U.S.C. 154(b) by 0 days.

(21) Appl. No.: 15/206,192

(22) Filed: Jul. 8, 2016

Related U.S. Application Data

(60) Provisional application No. 62/192,197, filed on Jul. 14, 2015.

(51) Int. Cl.
*H03H 7/38* (2006.01)
*H03H 7/40* (2006.01)
*H01P 5/04* (2006.01)
*G01R 27/32* (2006.01)

(52) U.S. Cl.
CPC ............. *H03H 7/40* (2013.01); *G01R 27/32* (2013.01); *H01P 5/04* (2013.01)

(58) Field of Classification Search
CPC ................................. H03H 7/38; H03H 7/40

USPC .................................. 333/17.3, 32, 33, 263
See application file for complete search history.

(56) References Cited

U.S. PATENT DOCUMENTS 7,102,457 B1 9/2006 Tsironis
9,602,072 B1* 3/2017 Tsironis .................... H01P 5/04

OTHER PUBLICATIONS

Tsironis, U.S. Appl. No. 12/929,643, "Calibration and tuning using impedance tuners".

* cited by examiner

*Primary Examiner* — Stephen E Jones

(57) ABSTRACT

A new multi-carriage slide screw impedance tuner uses a circular slabline, eccentrically rotating disc probes and rotating carriages allowing reducing the linear size of the tuner by a factor of 3 compared with linear tuners. The slabline lies flat on the bench table surface and the disc probes rotate at the end of rotating arms, which act as mobile carriages, forming a planetary configuration. The rotation of the arms control the phase of GAMMA and the rotation of the disc-probes controls its amplitude.

13 Claims, 15 Drawing Sheets

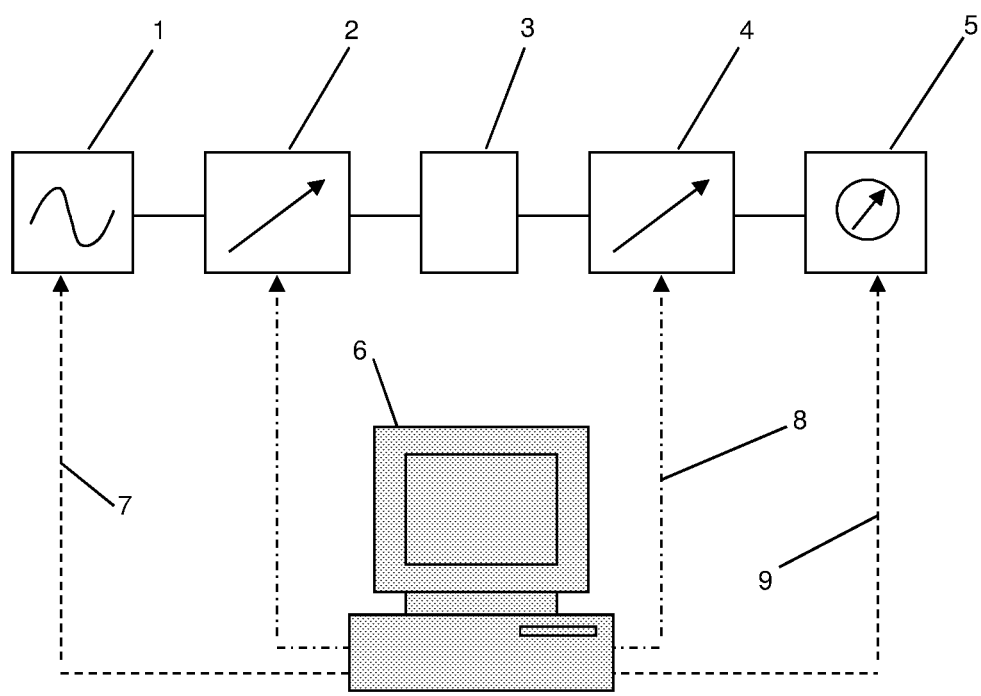
FIG. 1: Prior art

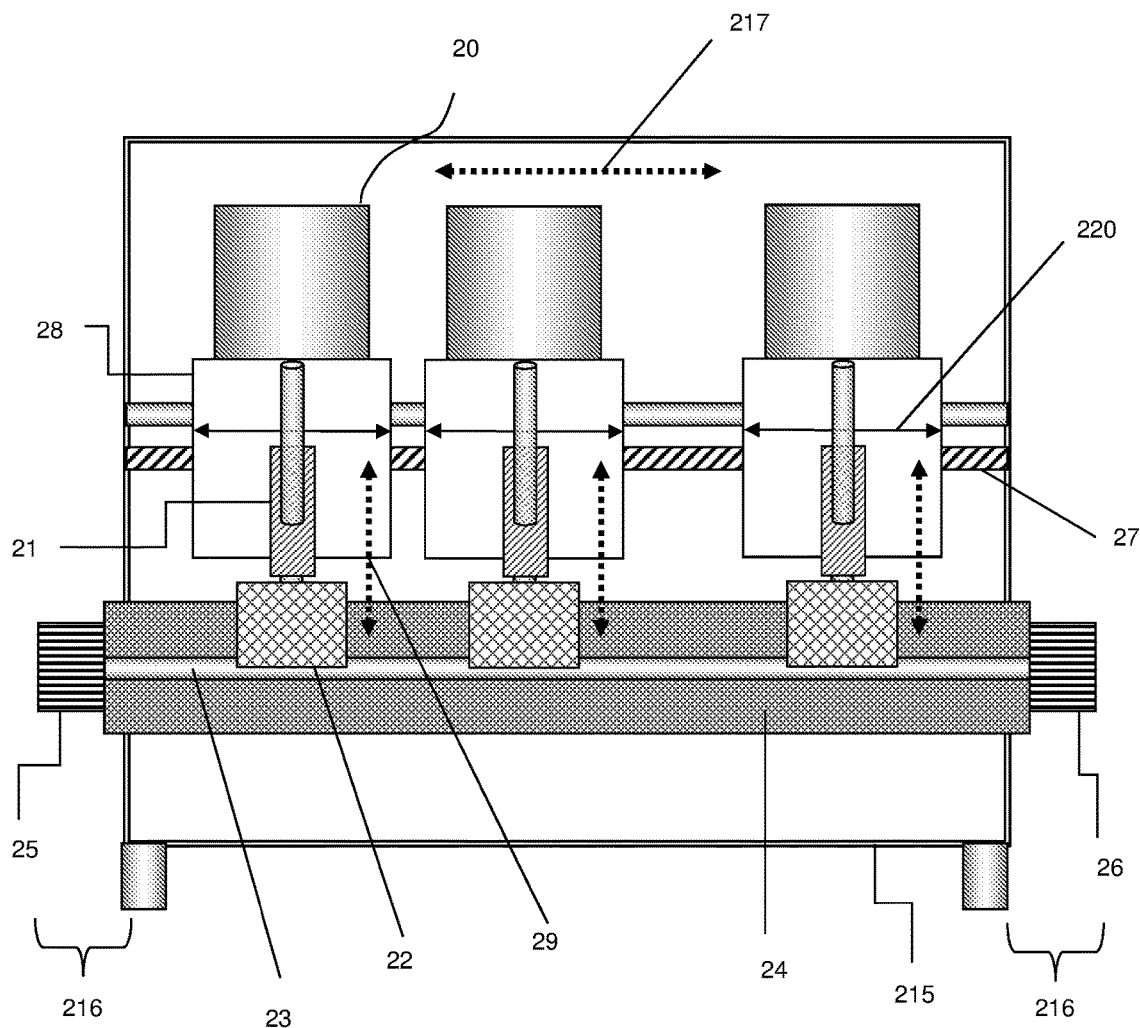
FIG. 2: Prior art

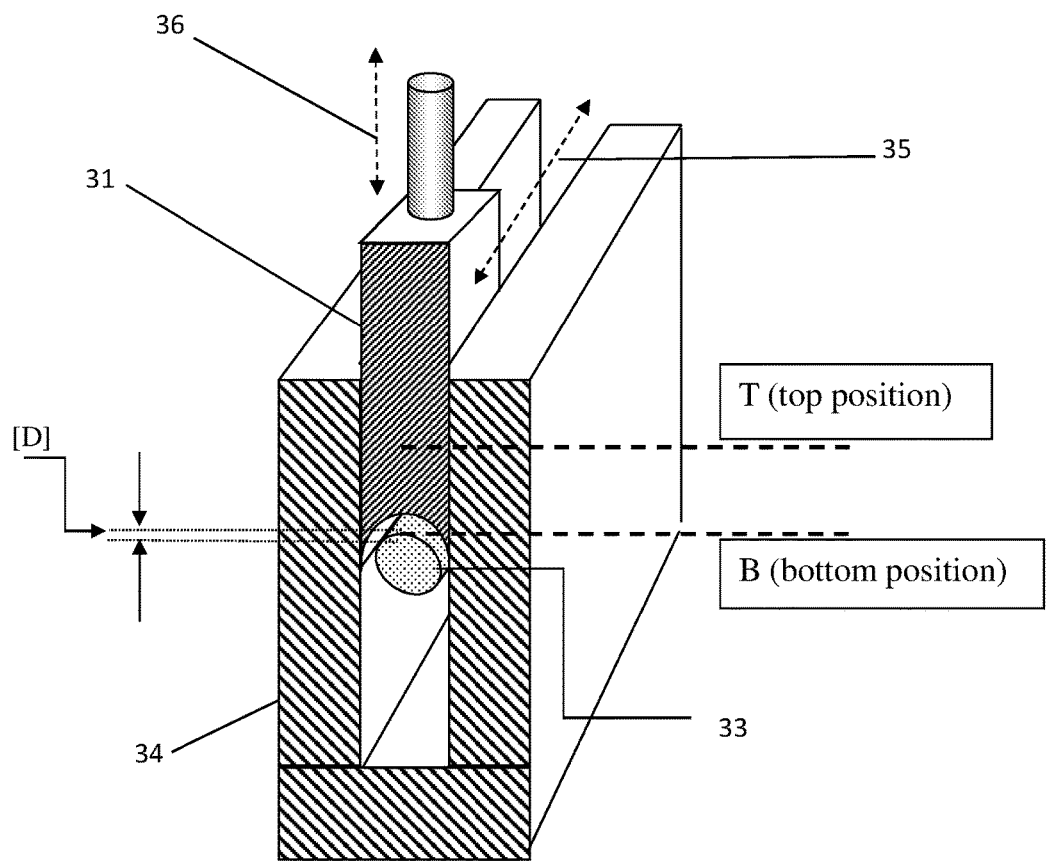
FIG. 3: Prior art

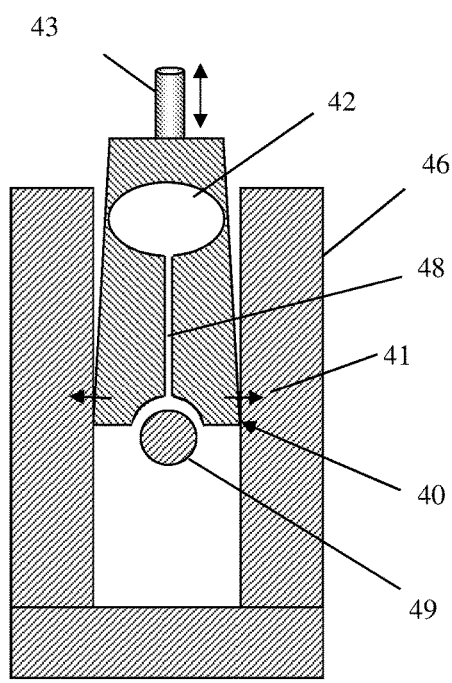 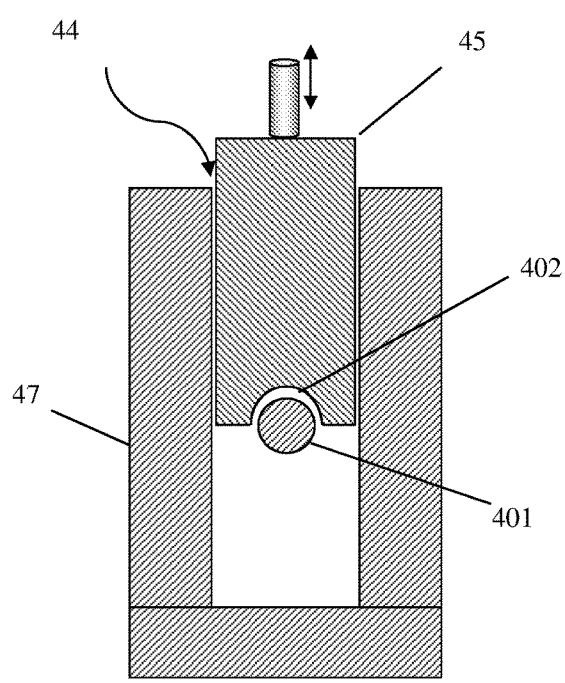
FIG. 4A: Prior art
FIG. 4B: Prior art

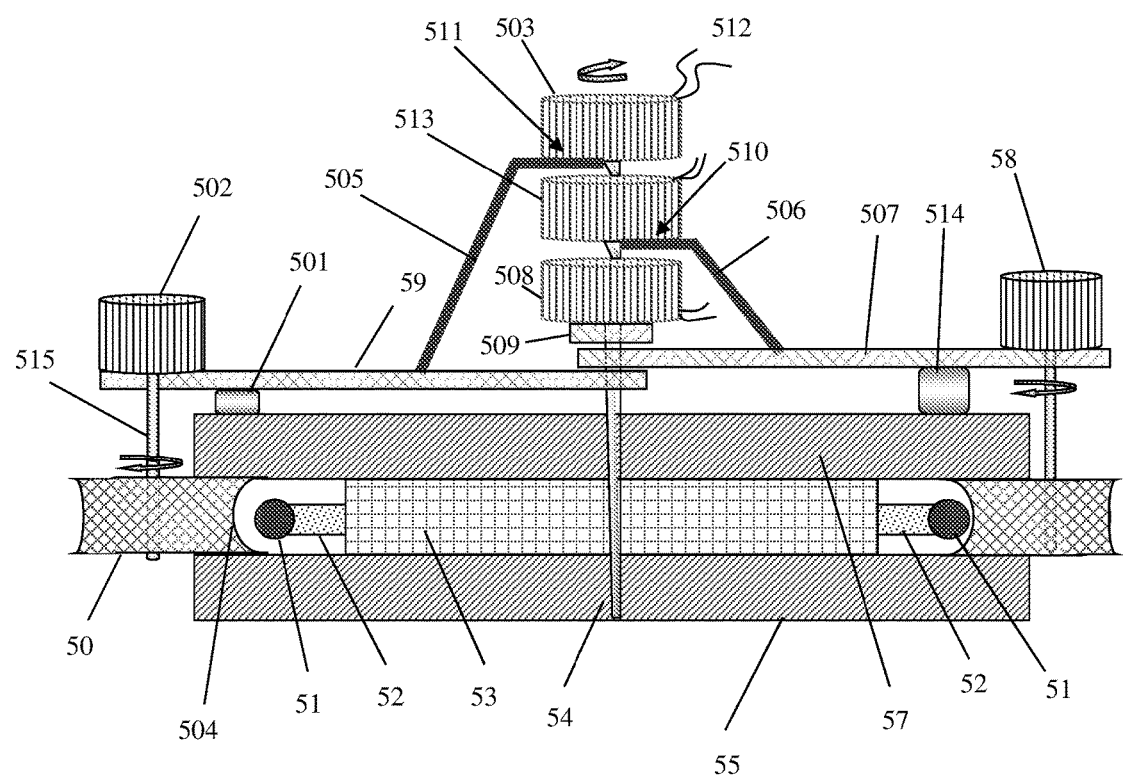
FIG. 5 (section A-B of Figure 6)

FIG. 12: Prior art

COMPACT MULTI-CARRIAGE IMPEDANCE TUNER AND METHOD

PRIORITY CLAIM

This application claims priority on provisional application 62/192,197 filed on Jul. 14, 2015, titled "Compact Multi-Carriage Impedance Tuner and Method".

CROSS-REFERENCE TO RELATED ARTICLES

1. Load Pull Measurements: http://en.wikipedia.org/wiki/Load_pull
2. "Computer Controlled Microwave Tuner—CCMT" Product Note 41, Focus Microwaves January 1998.
3. Standing wave ratio, VSWR: https://en.wikipedia.org/wiki/Standing_wave_ratio.
4. "High Resolution Tuners Eliminate Load Pull Performance Errors" Application Note 15, Focus Microwaves, January 1995.
5. Anodization: http://en.wikipedia.org/wiki/Anodizing
6. TSIRONIS, US patent application (allowed) Ser. No. 12/929,643, "Calibration and tuning using impedance tuners".
7. TSIRONIS, U.S. Pat. No. 7,102,457, "Mechanically balanced microwave load pull tuner".
8. Keith W. Whites, EE481-Microwave Engineering, Lecture 20: Transmission (ABCD) matrix, fall 2013; http://whites.sdsmt.edu/classes/ee481/

BACKGROUND OF THE INVENTION

This invention relates to RF load and source pull testing of medium and high power RF transistors and amplifiers using remotely controlled electro-mechanical impedance tuners.

Modern design of low noise or high power RF amplifiers and mixers, used in various communication systems, requires accurate knowledge of the active device's (microwave transistor's) characteristics. In such circuits, it is insufficient for the transistors, which operate as highly non-linear devices, close to power saturation, to be described using linear or non-linear numeric models.

A popular method for testing and characterizing such microwave components (transistors) in the non-linear region of operation is "load pull" or "source pull". Load/source pull is a measurement technique employing microwave impedance tuners and other microwave test equipment (FIG. 1), such as signal source (1), input and output tuner (2, 4), power meter (5) and test fixture (3) which includes the DUT. The tuners and equipment are controlled by a computer (6) via digital cables (7, 8 and 9). The microwave impedance tuners are devices which allow manipulating the RF impedance presented to the Device Under Test (DUT, or transistor) to test (see ref. 1); this document refers hence to "impedance tuners", in order to make a clear distinction to "tuned receivers (radios)", popularly called elsewhere also "tuners" because of the included tuning circuits (see ref. 2).

Electro-mechanical impedance tuners (FIG. 2) in the microwave frequency range between 100 MHz and 60 GHz are using the slide-screw concept and include a slabline (24) with a test port (25) and an idle port (26), a center conductor (23) (see also FIG. 3) and a number of mobile carriages (28) which carry a motor (20) each, a vertical axis (21) which controls the vertical position (29) of a reflective probe (22). The carriages are moved horizontally (217) by additional motors (not shown) and gear (27). The signal enters into one port (25) and exits from the other (26). In load pull the test port is the one where the signal enters, in source pull the test port is the one where the signal exits. The entire mechanism is, typically, integrated in a solid housing (215) since mechanical precision is of highest importance.

The typical configuration of the reflective probe inside the slabline is shown in FIG. 3: a number of such parallel conductive (preferably metallic) reflective tuning elements (31) also called "tuning" probes or "slugs", are inserted into the slotted transmission airline (34) and are coupled capacitively with the center conductor (33) to an adjustable degree, depending from very weak (when the probe is withdrawn, top position) to very strong (when the probe is very close (within electric discharge—or Corona distance "D", bottom position) to the center conductor; it must be pointed out that capacitive "tuning" probes are different from "sampling" probes, which are loosely coupled with the center conductor; when the tuning probes move vertically (36) between a "top position" and a "bottom position" and approach the center conductor (33) of the slabline (34) and moved along the axis (35) of the slabline, they alter the amplitude and phase of the reflection factors seen at the slabline ports, hereby covering parts or the totality of the Smith chart (the normalized reflection factor area). The relation between reflection factor and impedance is given by GAMMA=(Z−Zo)/(Z+Zo), where Z is the complex impedance Z=R+jX and Zo is the characteristic impedance. A typical value used for Zo is 50 Ohms (see ref. 3). When the tuner is terminated at one ports with Zo (50 Ohm), GAMMA at the other port is equal to the first element of the slabline s-parameter matrix: GAMMA=S11 when terminated at port 2 (the right port) or GAMMA=S22 when terminated at port 1 (the left port).

Up to now such metallic tuning probes (slugs, FIGS. 4A, and 4B), have been made in a cubical form (45) with a concave bottom (402) which allows capturing, when approaching the center conductor (401) (49), the electric field, which is concentrated in the closest space between the center conductor and the ground planes (47) of the slabline. This field capturing allows creating high and controllable reflection factors. Contact of the probes with the sidewalls (40, 44) is critical. It can be either capacitive (44, FIG. 4b) or galvanic (40, FIG. 4a). If the contact is capacitive, the surface of the probes and/or the sidewalls of the slabline must be electrically insulated. This can be done using chemical process such as anodization (see ref. 5). Capacitive ground contact means extreme requirement in sidewall planarity and straightness to keep the quasi-sliding contact constant for the whole length and depth of the slabline as the probe moves into and along the slabline. Galvanic contact is safer, more repeatable and less vibration sensitive, but requires a spring mechanism (41) to allow for constant pressure of the probe on the sidewalls (46) (FIG. 4A). This is made by machining a hole (42) and slot (48) in the probe body. The probe is held by the axis via a pin (43).

BRIEF DESCRIPTION OF THE SEVERAL VIEWS OF THE DRAWINGS

The invention and its mode of operation will be more clearly understood from the following detailed description when read with the appended drawings in which:

FIG. 1 depicts prior art, a typical automated load pull test system.

FIG. 2 depicts prior art, a front view of the structure of an automated slide screw impedance tuner using three carriages and RF tuning probes (slugs).

FIG. 3 depicts prior art, a perspective view of RF tuning probe (slug) inside a slotted airline (slabline) approaching the center conductor and the relevant dimensions and parameters of the operation.

FIG. 4A through 4B depict prior art, cross section of two typical probe configurations:

FIG. 4A depicts probe with galvanic ground contact to the slabline walls and spring mechanism; FIG. 4B depicts probe with capacitive RF ground contact.

FIG. 5 depicts cross section A-B of compact three carriage disc-tuner also shown in FIGS. 6, and 8.

FIG. 7 A through 7B depict disc probe.

DETAILED DESCRIPTION OF THE INVENTION

Figure 6:
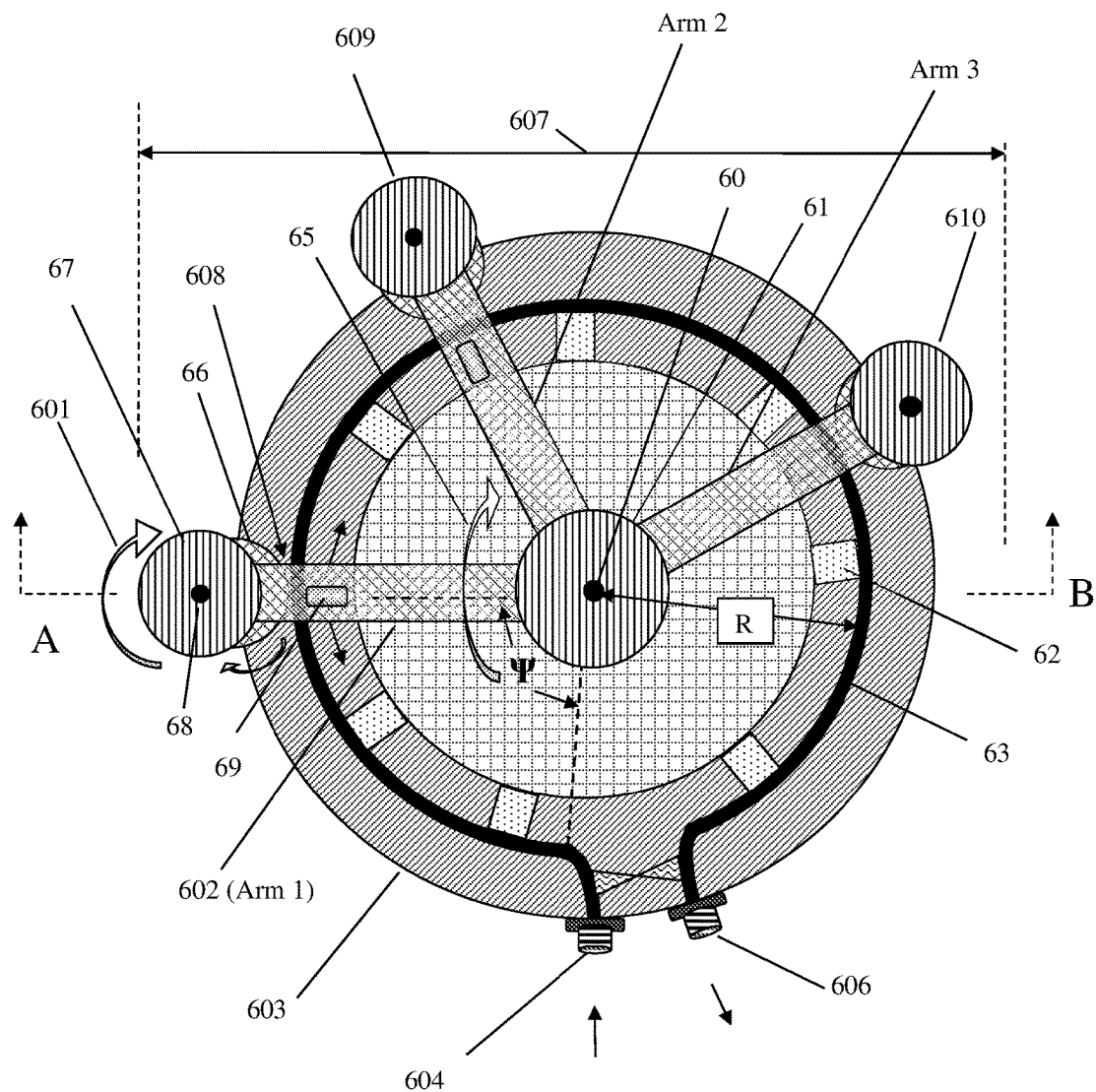
FIG. 6 depicts top view of the compact three carriage disc-tuner of FIG. 5, showing the tuning mechanisms of the three radial arm-carriages and disc-probes (2 planetary fashion rotations: arm rotation for control of phase of GAMMA and probe rotation for control of amplitude of GAMMA).

This invention discloses a new multi-carriage slide screw impedance tuner structure, the compact circular two or three carriage tuner. It comprises the following key components:

A. Circular horizontal slabline,

B. Circular, eccentrically rotating, or oval/elliptical disc-probes,

C. Mobile carriages in form of rotating arms.

The result of using the new structure is reduction of the overall length of prior art multi-carriage linear tuners by a factor of approximately 3: the compact-circular tuner is approximately ⅓ as long as a prior art linear tuner (compare FIGS. 2 and 8 and see ref. 2), which is important for on-wafer test setups, where space is at a premium; table I summarizes this:

TABLE I

Comparison total length of prior art and circular three carriage tuner

| Lowest Frequency [MHz] | Prior art three carriage Tuner Length [cm] | New circular three carriage Tuner Length [cm] | Length reduction ratio |
| --- | --- | --- | --- |
| 100 | 470 | 150 | 3.13 |
| 400 | 133 | 45 | 2.96 |
| 600 | 95 | 33 | 2.88 |
| 800 | 76 | 27 | 2.81 |

The total tuner length reduction ratio between the two tuner structures increases as the frequency decreases, because the carriage width (220) and the width of connectors and sidewalls (216) in a linear tuner (FIG. 2) are a fixed, frequency independent contribution to the overall length; the active section of horizontal travel of the tuner is one half of wavelength (λ/2) at the lowest operation frequency; this active section increases proportionally with decreasing lowest frequency but the walls, connectors and carriages remain the same. In the case of the circular tuner the connectors (604), (606) in FIG. 6, do not add to the overall length (607); the periphery center conductor (63) segments between the carriage-arms, Arm 1 (602), Arm 2 and Arm 3 shall be λ/2 at the lowest frequency, as in a linear tuner.

The circular tuner (FIGS. 5 and 6, FIG. 5 shows a cross section of FIG. 6) comprises a slabline made of two conductive (preferably metallic) discs (55, 57) which are held together by a disc formed spacer (53); the center conductor is a toroid (circular rod) (51) which follows the periphery of the spacer (53) and is secured in place by a number of supporting dielectric studs (52) distributed on the periphery of the spacer (53), shown as item (62) in FIG. 6. A vertical axis (54) is fixed in the center of the two discs (55, 57) and the spacer (53) and is the common rotation axis of three mobile radial arms (59, 509, 507), arm (509) points into the back, which (optionally) carry also the motor control (512) electronic boards for both motors of each carriage, motor pair examples (503,502) or (513, 58). The control boards are shown as items (803) and (804) in FIG. 8.

As an example of one rotating arm carriage: Motor (503) is attached to the mobile arm (59) using a bracket (505) and rotates with it; at the peripheral end of the arm (59) sits a second motor (502) which controls by its axis (515) directly, or via a gear, a metallic disc probe (50). Probe (50) rotates eccentrically (see FIGS. 7A and 14A); by rotating, the groove (504), which is carved into the periphery of the probe (50), approaches the center conductor (51) or withdraws from it, always remaining inside the channel of the slabline (55, 57), thus changing the amplitude of the reflection factor GAMMA. The arm (59) is supported by a rolling bearing (501) in order to maintain the centered vertical position of the probe (50) as it slides inside the slabline (55, 57).

The same mechanism is used for the two other carriage-arms (509, 507), rotating around axis (54) their rotation being controlled by primary motors (508, 513), supported by roller bearings (514), attached (511) (510) to brackets (506) and carrying secondary motors (58) and disc-probes.

A top view of the tuner is shown in FIG. 6; several elements of the cross section view of FIG. 5 are better visible in this view: the circular top and bottom plates (603), the circular center conductor (63) the several low dielectric factor (∈$_r$) supporting studs (62) distributed along the periphery, and the input and output coaxial ports (604) and (606); visible are also, for the first (503) rotating arm (602), motors (61) and (67) and supporting bearing (69), and part of the disc probe (66) rotating eccentrically around axis (68) at the edge of the first arm-carriage (59, 602). The rotation (601) of the probe (66) controls the amplitude of GAMMA of this probe as it approaches the center conductor at point (608); the rotation (65) of the arm (602) around the center (60) controls the phase Ψ of GAMMA=|GAMMA|*exp(jΨ) as it changes the distance between the input port (604) and the point (608), where the reflection is created.

The same mechanism repeats for "Arm 2" (509) and "Arm 3" (507), shown in cross section in FIG. 5. The verbatim description is not repeated here for the top view for Arms 2 (motor (609)) and 3 (motor (610)), because the mechanism is identical.

Figures 7A, 7B:
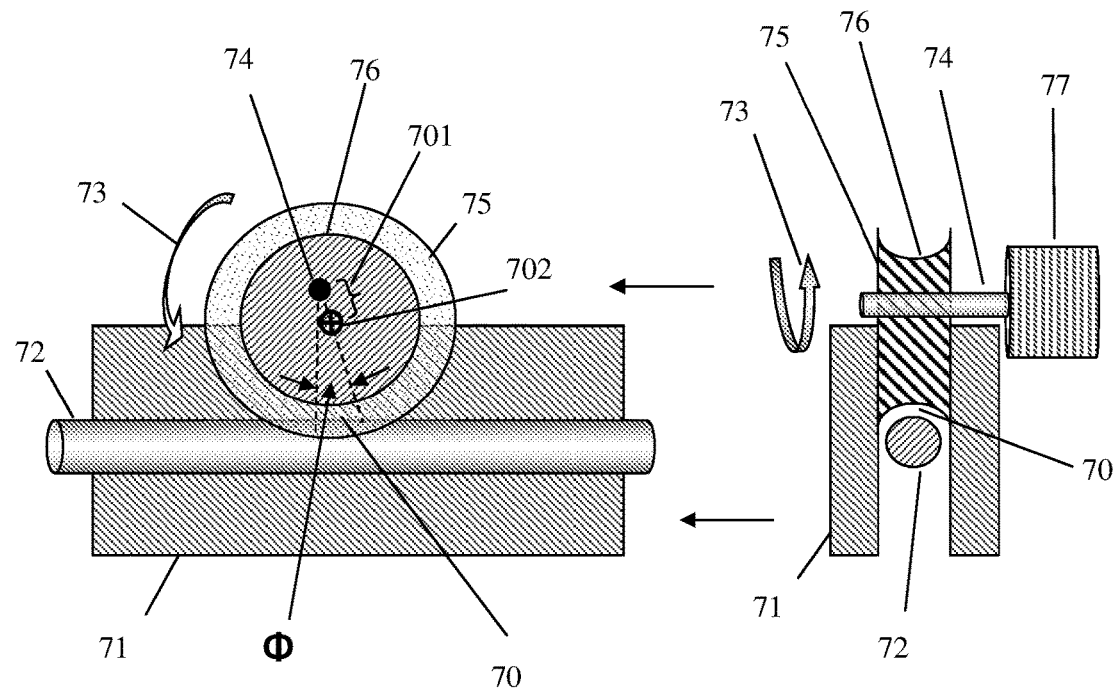
FIG. 7A depicts front view (in actual tuner this is a "top" view) and FIG. 7B depicts cross section view, of the eccentrically rotating circular disc-probe and its operation inside the circular slabline.
Figures 14A, 14B:
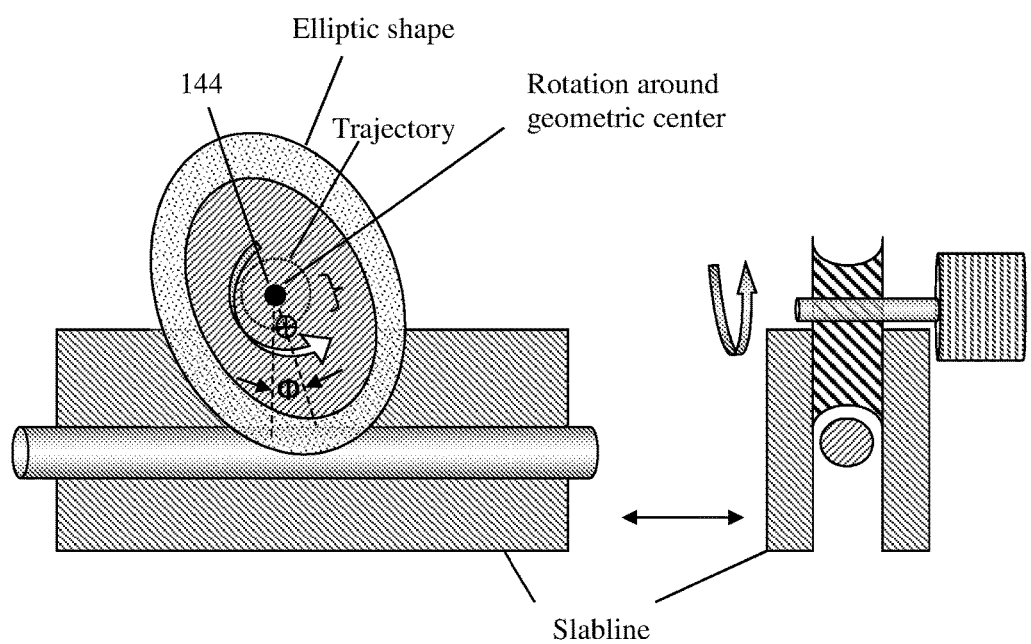
FIG. 14A depicts not circular (i.e. oval and elliptical) shaped disc-probes and insertion operation inside the circular slabline (i.e. |GAMMA| control)
FIG. 14B depicts a cross section view

The control mechanism for the amplitude of GAMMA is shown in detail in FIGS. 7 and 14: in the case of a circular probe (FIG. 7A) the rotation axis (74) of the disc probe (75) is placed eccentrically; in the case of oval (or elliptic) probes (FIG. 14A) the rotation axis may be identical with the geometrical center, since the oval shape will create the variance in probe insertion depth in the slabline. By rotating (73) the probe, using the motor (77) one controls the coupling (distance (70)) between the bottom of the channel and the center conductor (72)) and electric field capturing around the circular center conductor (72); this changes the amplitude of GAMMA between a minimum value close to 0 and a maximum value close to 1. By shaping the form and depth of the channel (groove) (76) and adjusting the eccentricity (701) between the rotation axis and the geometric center (702) of the disc-probe, we can adjust the minimum and maximum proximity and overlapping between the probe (75) and the center conductor (72) seamlessly and continuously and thus control the amplitude of GAMMA. By varying the eccentricity distance (701) we can create extremely high tuning resolution (change in |GAMMA| as a function of rotation angle Φ; on the other hand, in order to create acceptable minimum (residual) |GAMMA| (corresponding to tuner initialization) the eccentricity (701) must have a minimum size. It has been found experimentally and through simulations, that such typical size is at least 2 times the diameter of the center conductor. The rotation axis (74) is attached directly or using a gear to an electric stepper motor (77), which controls the rotation angle and by that the distance (70) and overlapping between the disc-probe (75) and center conductor (72) of the slabline (71).

When elliptic or oval probes are used, rotation axis and geometric center (144) can be identical. Beyond this difference the remaining details are the same as in the FIGS. 7 A and 7 B.

Figure 12:
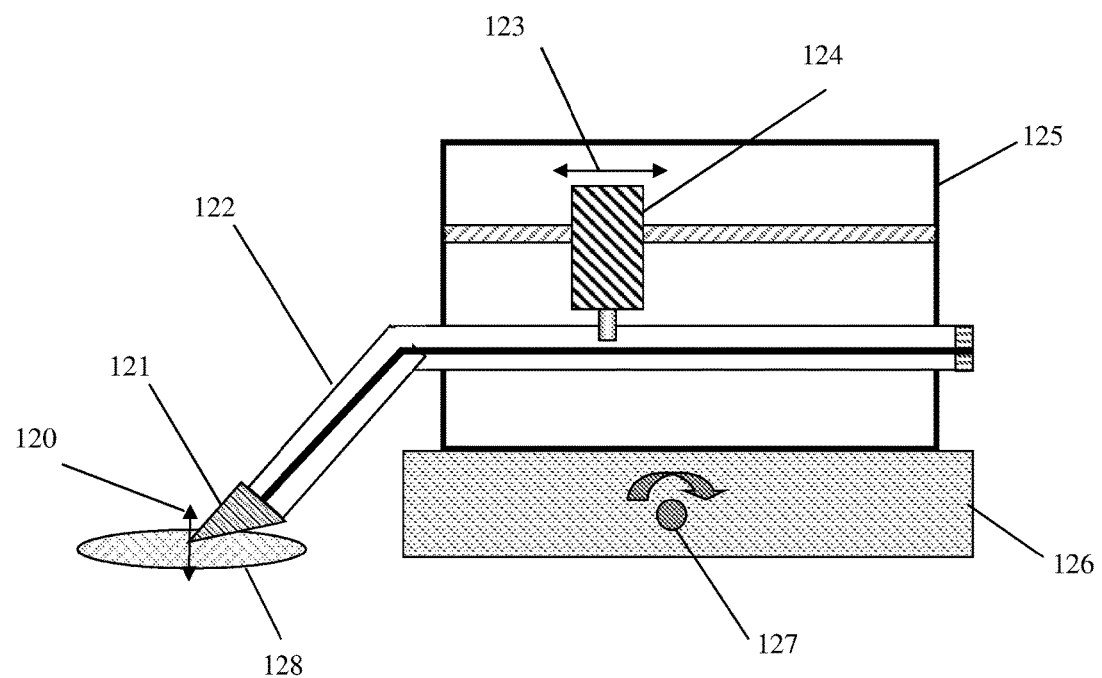
FIG. 12 depicts prior art, tilting of linear prior art tuner due to horizontal movement of massive carriage creating vertical movement and stress on wafer probes.
Figure 13:
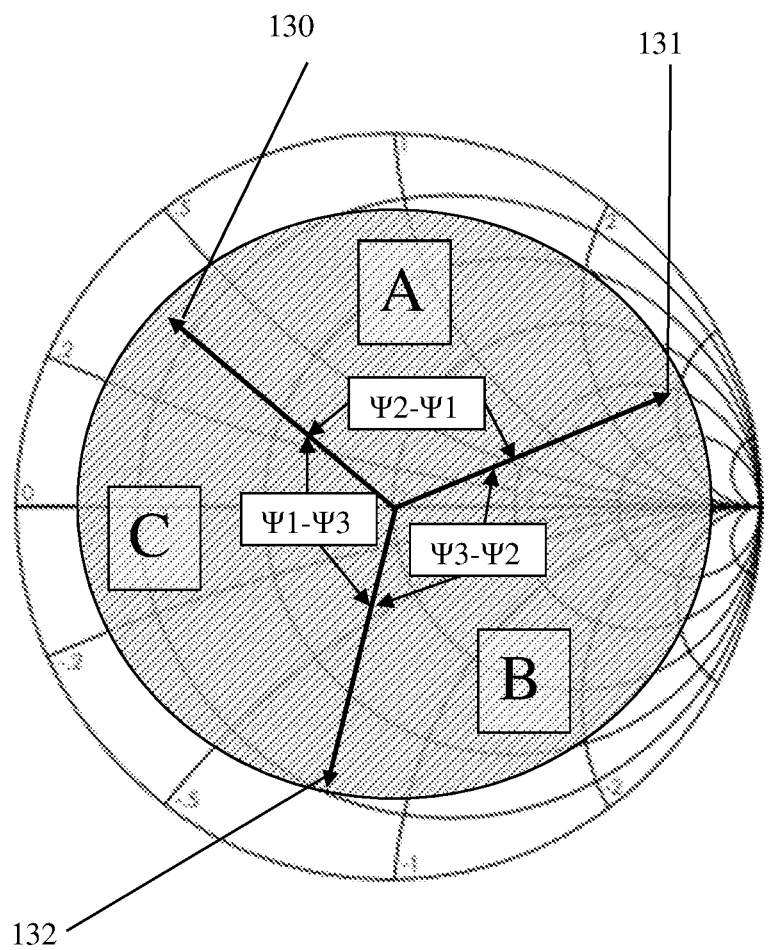
FIG. 13 depicts full Smith chart tuning coverage mechanism using only disc-probe rotation at properly spaced fixed carriage radial arms.

In a single carriage tuner (125), whether linear (FIG. 12) or circular (envision the apparatus of FIG. 6 without Arms 2 and 3) the center of gravity moves (123) with the carriage (124) and the tuner will tilt around axis (127), even if the tuner is solidly mounted on a positioner (126). If the tuner is rigidly connected (122) with the wafer probe (121), a vertical wafer probe movement (120) will occur and may cause the probe's loss of contact with the wafer (128) or the wafer probe's destruction. In that case a compensation mechanism is required (see ref. 7) or a tuning mechanism must be used, which allows tuning without changing the "horizontal" (or, in the case of a circular tuner "angular") position of the carriages. This is possible using three carriages (probes) appropriately spaced horizontally (FIG. 13). The tuning mechanism shown in FIG. 13 demonstrates the capacity of a three-independent-carriage/three-probe tuner to generate reflection factors covering the whole Smith chart using only amplitude control of the reflection factor. Segment A is covered when probes 1 (130) and 2 (131) are inserted at various degrees, and probe 3 (132) is withdrawn. Any vector in segment A can be synthesized as a vector sum of vectors (130) and (131). Segment B is covered by probes 2 (131) and 3 (132) with probe 1 (130) withdrawn, following the same mechanism as in the case of segment A. Segment C finally is covered using probes 3 (132) and 1 (130). In an ideal case the angle between vectors must be 120 degrees, which of course is valid for a single frequency only. The concept, using only two probes at a time, is accurate for a single frequency, in praxis though, it has been found that if all three (vertically only moving) probes are used for tuning and are inserted at various degrees, they allow operation over a wider frequency range. However, for frequencies further away from the center frequency the angular distance Ψ between tuning arms is adjusted fully automatically using numeric search of optimum configurations through the tuner calibration data (see FIG. 11).

Figure 10:
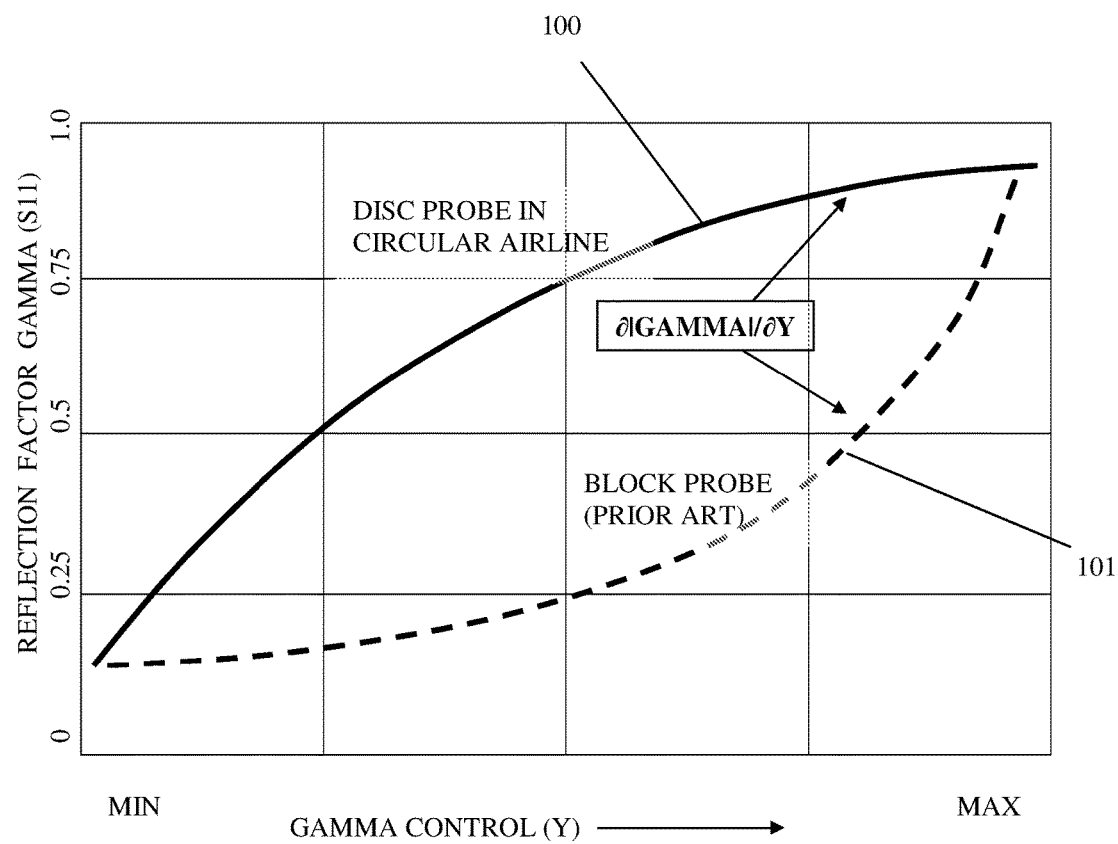
FIG. 10 depicts the comparative reflection behavior of disc probes versus prior art cubical (block) probes as a function of probe penetration (Y) into the slabline.

The tuning resolution (TR) of the tuner at the closest point between probe bottom and center conductor (608), FIG. 6 and (70), FIG. 7A, is inversely proportional to the change in |GAMMA| as a function of the change in probe rotation angle Φ: $TR=1/\{\partial|GAMMA|/\partial\Phi\}=1/\{(R+r)*sin(\Phi)\}\approx 1/\{(R+r)*\Phi\}$, for small angles Φ; hereby Φ is the angle of rotation of the geometrical center of the probe (702) around the actual rotation axis (74); for Φ≈0 the Tuning Resolution TR becomes close to infinite: $TR=\partial\Phi/\partial|GAMMA|\approx\infty$. Typical reflection behavior of the two types of tuning probe compared here is shown in FIG. 10. Trace (100) corresponds to the rotating disc-probe, used in the here disclosed circular tuner, whereas trace (101) corresponds to the prior art cubical probe (slug), FIGS. 3 and 4, which is used in linear, prior art tuners. In FIG. 10 the horizontal axis is denominated generally as "Y", whereby in prior art tuners this signifies the vertical axis position (36) and distance (D) between the probe and the center conductor of the slabline (FIG. 3), whereas in circular tuners with disc probes "Y" corresponds to a distance created by the eccentric rotation of the probe, ensuring that at certain angles the disc-probe will be as close to the center conductor as the cubical probe (slug) for creating the same level of reflection. The superior resolution of the disc-probe at high GAMMA is immediately obvious. Tuning resolution is important for tuner accuracy, since, at high tuning resolution (which in our case corresponds to maximum GAMMA) the effect of mechanical repeatability errors and motor step loss on tuning inaccuracy is strongly reduced. This means that small mechanical errors in probe positioning would cause negligible tuning errors. This is opposite, and much more accurate, than in prior art tuners, where tuning resolution decreases at high GAMMA (101), see ref. 4.

Figure 8:
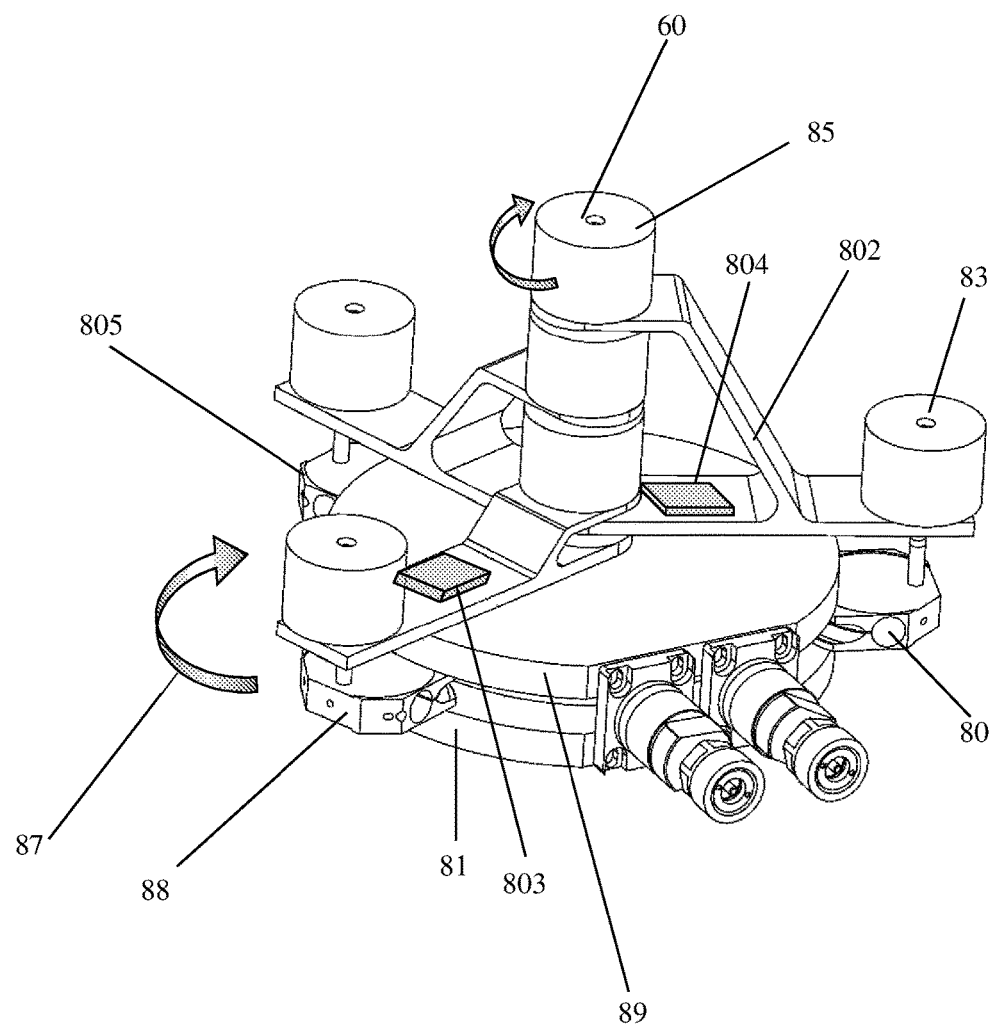
FIG. 8 depicts a perspective view of the compact three carriage circular disc-tuner.

A perspective view of the three carriage/three probe circular tuner is shown in FIG. 8, where most parts disclosed hitherto are visible: For each probe, motors for phase control (85) and amplitude control (83) of GAMMA are shown; motor (85) rotates the arm (carriage) (802) and controls the phase of the reflection factor (<GAMMA>) created by probe (80); motor (83) rotates the probe (80) and controls the amplitude of the reflection factor |GAMMA|. The same type of mechanism enables the phase and amplitude control of the reflection factors created by the other two probes (88) and (805). Also shown are the top (89) and bottom (81) plates of the slabline; probe rotation (87) and disc-probes (88), (80) and (805); each probe comprises a center hole (80) for practical reasons (see FIG. 4a), in order to establish reliable sliding contact with the slabline walls. Electronic control boards can be placed on the rotating arms (803), (804) in order to avoid entangling cables.

Figure 9:
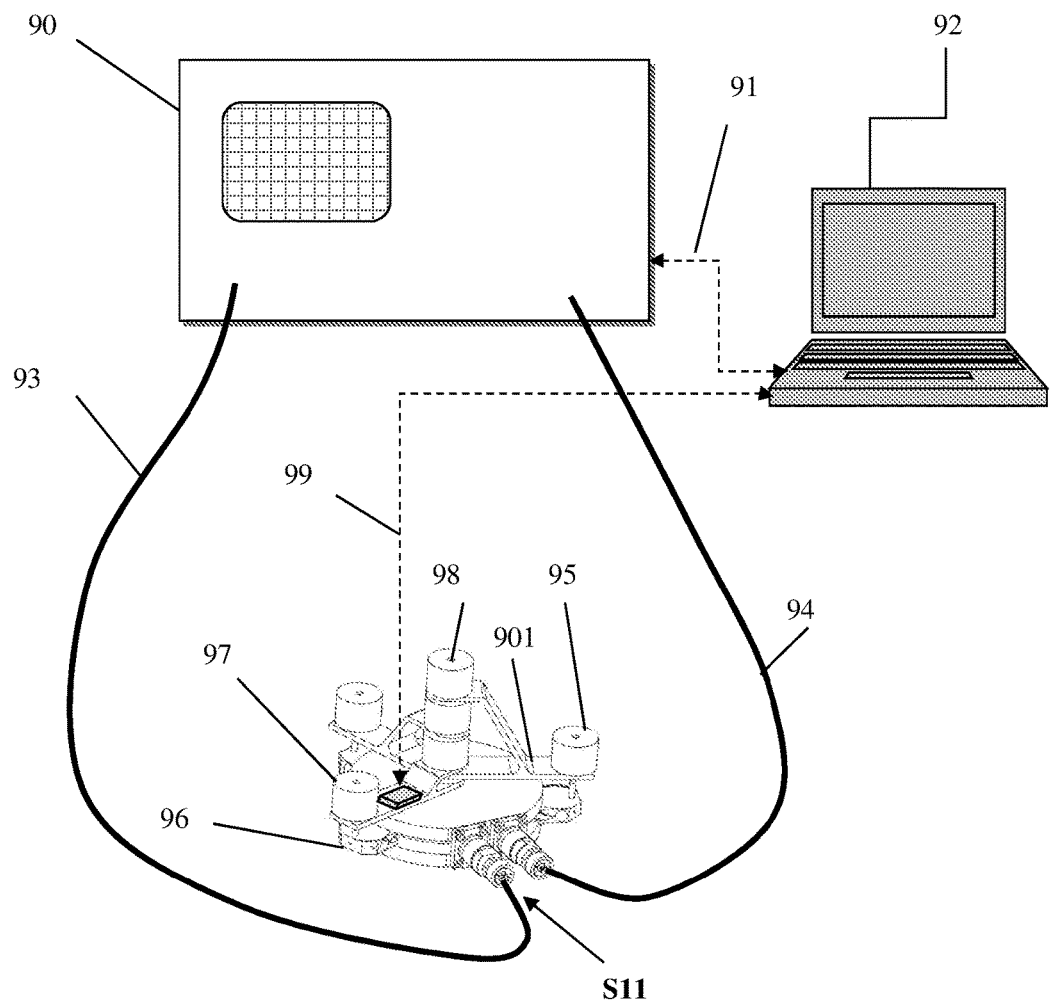
FIG. 9 depicts a setup to calibrate the compact circular disc-tuner.
Figure 11:
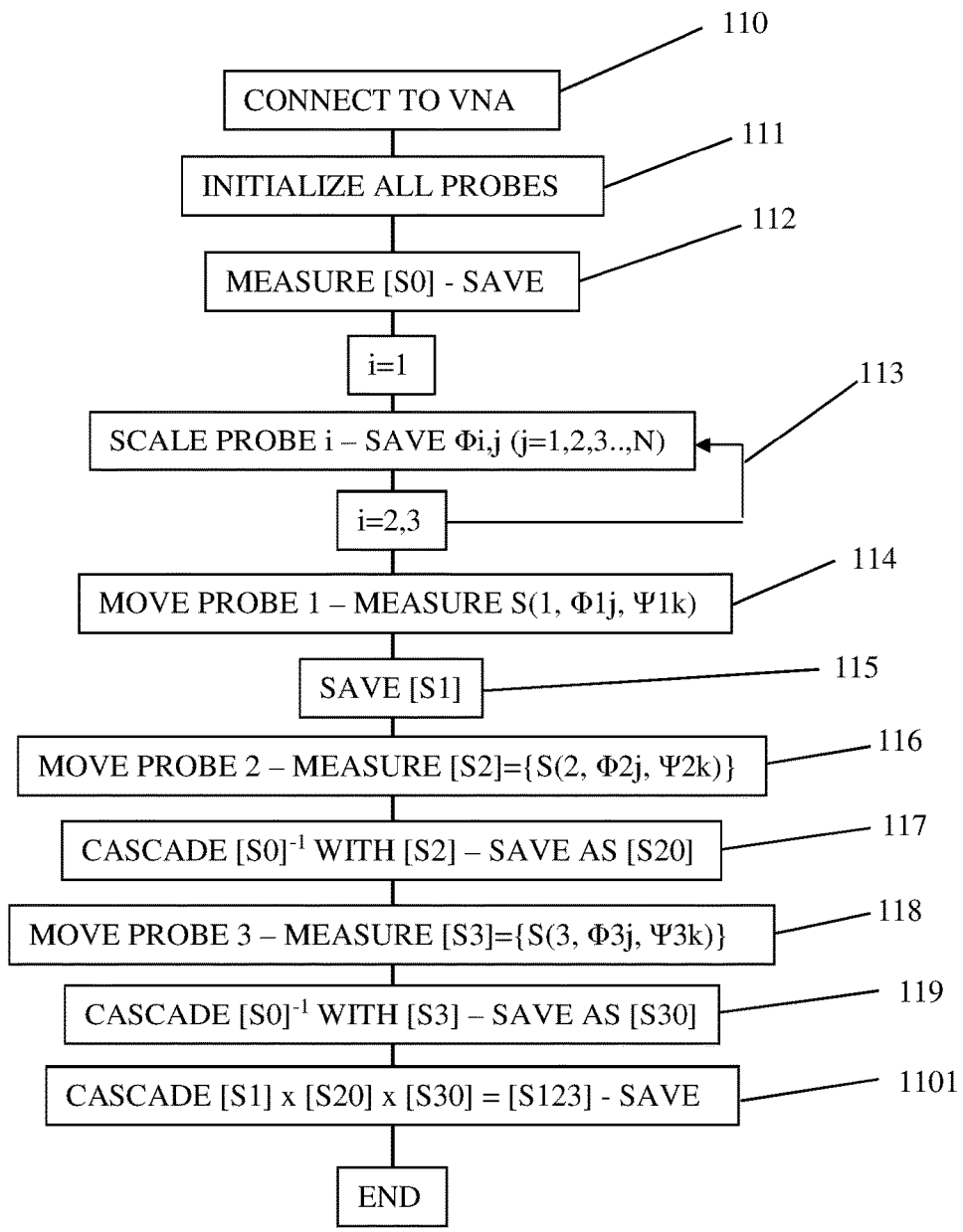
FIG. 11 depicts a flowchart of calibration procedure of compact three carriage disc-tuner.

The tuner calibration process uses a setup as shown in FIG. 9 and a procedure outlined in the flowchart of FIG. 11: The tuner is connected (FIG. 9) to a pre-calibrated vector network analyzer (VNA) (90) using high quality RF cables (93, 94); the VNA communicates (91) with the control computer (92); all the stepper motors, here only some of them are marked (95, 97, 98), are directed by the control boards, shown here only for one carriage (99), which communicate centrally with the computer (92), using digital communication (99), to rotate the disc probes (96) into the slot of the slabline in order to control the amplitude of |GAMMA| (angle $\Phi$); and to rotate the arms (901) around the center of the slabline (angle $\Psi$), in order to adjust the phase of the reflection factor (<GAMMA>), all while reading the four scattering parameters (s-parameters) from the VNA (90), using standard communication cable (91) and protocol.

After connecting to the VNA (110) and initializing all disc-probes and carriage arms (111), the matrix of the initialized tuner [S0] is measured and saved (112) at all frequencies of interest (Fn) (typically including harmonic frequencies of all selected fundamental frequencies). In a second (scaling) step, the reflection factor of the tuner at the test port is measured for each disc-probe separately, while all other probes remain withdrawn from the slabline (loop (113)); this is done at typically j=1, 2, . . . N steps, whereby typically $5 \leq N \leq 30$, corresponding to N angle values $\Phi_{i,j}$ of each disc-probe "i"; these angle values correspond to minimum and maximum GAMMA (or S11), and saved in a scaling file in the form $S11(\Phi_{i,j}, \Psi_{i,o})$; whereby $\Phi_{i,j}$ is the relative angle of the probe "i" rotation, starting with an initial position (zero), relative to the vertical direction (FIG. 7A) and $\Psi_{i,o}$ is the arm "i" rotation initialization angle, corresponding to "horizontal" zero in a linear tuner (see ref. 6);

Subsequently (114) two-port s-parameters for rotating disc-probe 1 and arm-carriage 1 are measured for all $\Phi_{1,j}$ angles ($1 \leq j \leq N$) and a multitude of $\Psi_{1,k}$ (typically $8 \leq k \leq K$, whereby K increases with |GAMMA| in order to keep the space between calibrated points on the Smith chart equidistant leading to regular cover of the Smith chart, which increases the interpolation accuracy; s-parameters are saved (115) for combinations of both angles $\Phi_{1,j}$ and $\Psi_{1,k}$ in the matrix form $[S1,ij(\Phi_{1j}, \Psi_{1,k})]$.

NOTE: the horizontal position in a linear tuner (FIG. 2) corresponds to the angle $\Psi_{1,j}$ of the rotating arm (602) from a starting reference angle $\Psi_{1o}$ (can be set arbitrarily to zero), and a maximum angle $\Psi_{1max}$; the angle $\{\Psi_{1max}-\Psi_{1o}\}$ corresponds to a linear travel of the probe of at least one half of a wavelength at the periphery at the selected frequency in order to cover all phases of the reflection factor (S11): $\Psi_{1max}-\Psi_{1o} \geq \lambda/(2*\pi*R)$, whereby R is the radius of the circular (toroid) center conductor and $\lambda$ the wavelength at the test frequency. This procedure is repeated for each fundamental frequency of interest and the data are saved for later use. These relations are valid for all probes and arm-carriages. S-parameters are measured and saved at fundamental and harmonic frequencies during calibration, but scaling is performed only at the fundamental frequency.

In a next step (116), disc-probe 1 and arm-carriage 1 are initialized and the previous procedure is repeated for disc-probe 2 and arm-carriage 2 (116), with one exception: before saving, the s-parameters measured when controlling probe 2 i.e. $[S2,ij(\Phi_{2j}, \Psi_{2,k})]$ are de-embedded with the matrix [S0] (i.e. they are converted to the equivalent transmission matrices $[T2,ij(\Phi_{2j}, \Psi_{2,k})]$ and multiplied with the inverse transmission matrix $[T0]^{-1}$, [T0] being the transmission matrix corresponding to [S0], see ref. 8, (117)). This is done in order to avoid including in the tuner calibration data the parameters of the initialized tuner more than once, since the individual probe sections of the tuner cannot be extracted physically and measured separately.

In a next step the procedure (116) used for probe 2 is applied to the third probe (118). Again after termination the tuner matrix [S0] is de-embedded from the measured data (119). At the end all matrix permutation items are cascaded (converted to [T] matrices, multiplied and converted back to [S] matrices) and a general multi-carriage calibration matrix is generated (1101). Depending on the total number of combined probe and carriage phases used (typically 1000) this global matrix may contain up to $1000 \times 1000 \times 1000 = 10^9$ s-parameter sets. However practical tests have shown that operation with as low as $10^7$ sets while providing much higher tuning speed it ensures sufficient accuracy.

Impedance synthesis using s-parameters of pre-calibrated impedance tuners is a specific procedure for each type of tuner, which, in principle, has been disclosed before (see ref. 6); this does not, however, limit the scope of the invention itself, since the invention relates to the new circular multi-carriage tuner type, using a disc-shaped slabline, rotating radial arm-shaped carriages and disc-probes moving following a planetary scheme: rotating at the end of the arm carriages around the center of the slabline discs and around themselves. Control software allowing calibration and tuning is required specifically for this type of apparatus using the general ideas from prior art. The calibration procedure has been laid out in order to manifest the fact that this wideband tuner can equally be used for mechanically stable as well as harmonic impedance synthesis, when calibrated and the calibration data used accordingly.

When a multi-frequency impedance synthesis (tuning) of a set of GAMMA(Fi) is requested by a user (Fi=F1, F2, F3, typically F1=Fo, F2=2Fo, F3=3Fo) the computer loads the calibration data from memory storage (hard-disk) into its active memory (RAM) for all requested frequencies Fi and scans through the S11(Fi) data points to find the closest match between calibrated reflection factor points and the requested GAMMA(Fi) (or impedances Z(Fi)) for all frequencies Fi. After this first step a second search is performed, in which interpolated data between calibration points are used (see ref. 4) and a final match is found, usually very close or identical to the requested values, within approximately 1% or better in reflection factor terms. The tuning error TE is defined as TE=$\Sigma\{W(Fi)*|GAMMA.target-GAMMA.tuned|^2\}$, whereby vector GAMMA=|GAMMA|*exp(j<GAMMA>), whereby <GAMMA> is the angle of the reflection factor and W(Fi) are user-defined weighting factors allowing enhancing tuning accuracy at selected frequencies (typically Fo) and avoiding over-specification and associated increase in tuning time.

The four interpolated complex s-parameters Sij, $\{i,j\}=\{1, 2\}$ of the tuner are calculated for an arbitrary state ($\Phi$, $\Psi$) using a set of the 9 closest calibrated states and the following interpolation relations:

$$Sij(\Phi,\Psi k)=A(\Phi)*Sij(\Psi k,\Phi 1)+B(\Phi)*Sij(\Psi k,\Phi 2)+C(\Phi)*Sij(\Psi k,\Phi 3), \quad (1)$$

$$Sij(\Phi,\Psi)=A(\Psi)*Sij(\Psi 1,\Phi)+B(\Psi)*Sij(\Psi 2,\Phi)+C(\Psi)*Sij(\Psi 3,\Phi), \quad (2)$$

whereby $\{i,j\}=\{1,2\}$ and $k=\{1,2,3\}$, whereby $\Phi 1 < \Phi 2 < \Phi 3$ and $\Psi 1 < \Psi 2 < \Psi 3$ as well as $\Phi 1 < \Phi < \Phi 3$ and $\Psi 1 < \Psi < \Psi 3$.

The coefficients A, B, C are calculated using the following relations:

$$A(\Theta)=(\Theta-\Theta 2)*(\Theta-\Theta 3)/((\Theta 1-\Theta 2)*(\Theta 1-\Theta 3)); \quad (3)$$

$$B(\Theta)=(\Theta-\Theta 1)*(\Theta-\Theta 3)/((\Theta 2-\Theta 1)*(\Theta 2-\Theta 3)); \quad (4)$$

$$C(\Theta)=(\Theta-\Theta 2)*(\Theta-\Theta 1)/((\Theta 3-\Theta 2)*(\Theta 3-\Theta 1)); \quad (5)$$

whereby $\Theta$ is a generic variable that can be replaced, in equations (3) to (5), by $\Phi$ or $\Psi$ accordingly; $\Psi$ corresponds to the physical rotation angle of the mobile arm, and thus to the linear distance between the test port and the probe or the equivalent horizontal position of the probe in a prior art linear tuner, and $\Phi$ corresponds to the rotation of the disc probe and thus controls the distance between the bottom of the probe groove and the center conductor inside the slabline, or the vertical position of prior art probes. These formulas allow calculating the s-parameters of the tuner using 9 calibrated points ($\Psi i,\Phi j$) with $\{i, j\}=\{1,2,3\}$, surrounding the requested generic target position $\{\Psi, \Phi\}$ on the Smith chart. The 9 calibrated points are divided in 3 sets: set 1: ($\Psi 1,\Phi 1$), ($\Psi 1,\Phi 2$), ($\Psi 1,\Phi 3$); set 2: ($\Psi 2,\Phi 1$), ($\Psi 2,\Phi 2$), ($\Psi 2,\Phi 3$); and set 3: ($\Psi 3,\Phi 1$), ($\Psi 3,\Phi 2$), ($\Psi 3,\Phi 3$), whereby both angles $\Phi$ and $\Psi$ increase monotonically ($\Phi 1<\Phi 2<\Phi 3$ and $\Psi 1<\Psi 2<\Psi 3$) and $\Phi$ and $\Psi$ are within the boundaries of $\Phi 1$ to $\Phi 3$ and $\Psi 1$ to $\Psi 3$. The $\Psi i$ and $\Phi j$ values are the angular coordinates of the closest calibrated points to the target reflection factor. The choice is adequate because a rotation of the arm ($\Psi$) changes the distance of the probe and the carriage from the test port and thus the phase of the reflection factor and a rotation ($\Phi$) of the disc-probe changes the gap between the probe and the center conductor and thus the amplitude of the reflection factor. The flowchart of this operation is an extension of the flowchart in FIG. 15, whereby step (157) is omitted and loop (153) is repeated for all angular positions "k" of all arms "i" ($\Psi i,k$); this repeated "k" loop is nested inside the "j" loop (153) starting at node (158).

Figure 15:
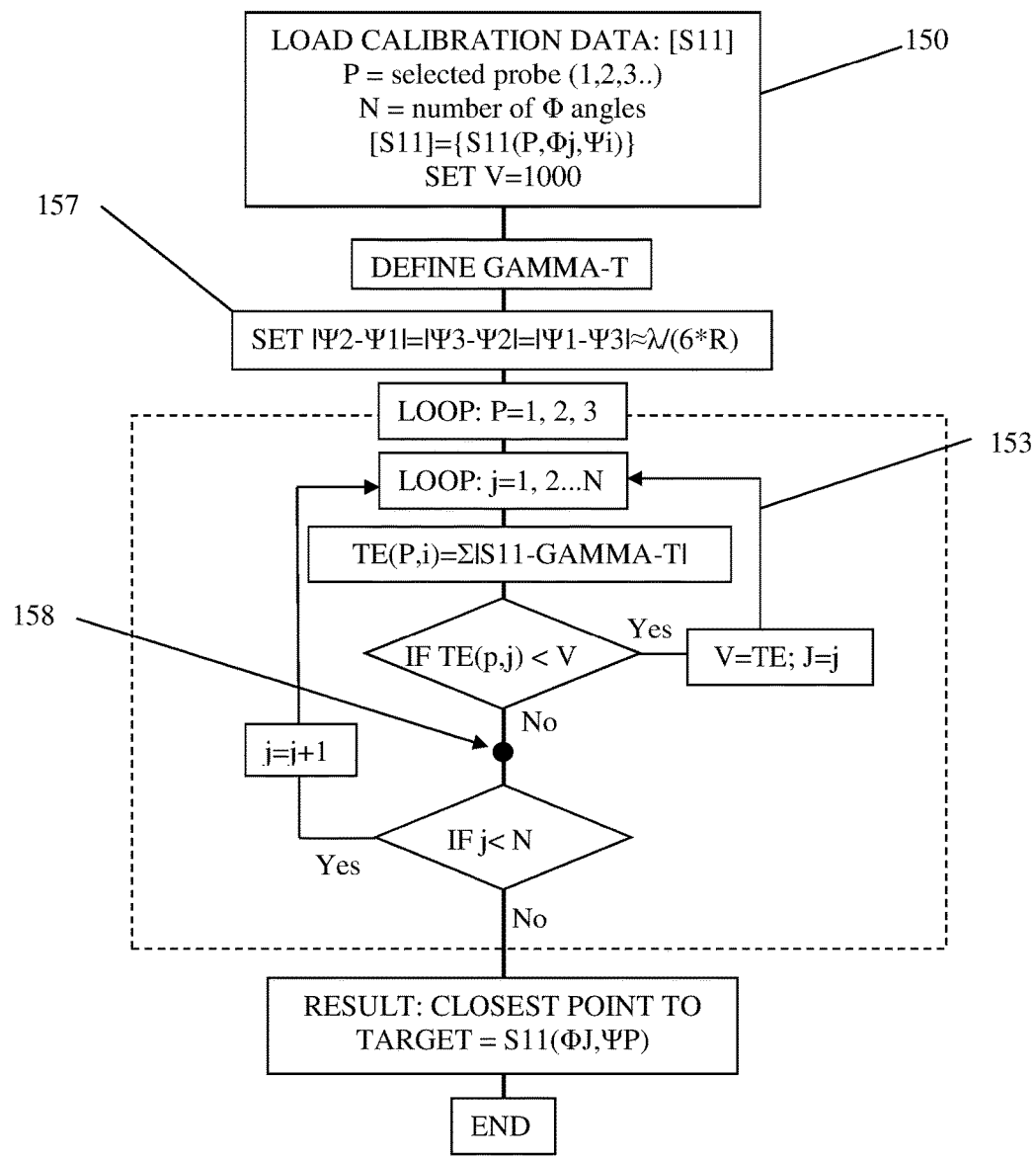
FIG. 15 depicts a flow chart of tuning algorithm for stable tuning and, by adding a secondary search loop for general tuning, procedure.

If a mechanically stable tuning is required, meaning only disc-probe rotation around their own axes is allowed, only tuners with at least three mobile carriages and probes can be used, if the totality of the Smith chart shall be tunable to. Before any tuning operations, therefore, the most appropriate angular positions of the arm-carriages must be determined to allow this coverage. The search flowchart for this operation is shown in FIG. 15. Even though it is possible to aim at covering only a specific area of the Smith chart, the general procedure disclosed here is most adequate for all areas of the Smith chart, because it allows best positioning the arm-carriages to reach this objective: In a first step the tuner calibration data are loaded in computer memory (150); this defines the index (N) of the probe rotation angle $\Phi_N$, of each probe, for which S11 is maximum; and the total number (M) of arm-carriage angular positions $\Psi$ associated with $\Phi_N$, required to allow rotation of the reflection factor GAMMA by 360 degrees (corresponding to $\lambda/2$ peripheral travel). To find the best arm-carriage positions for best Smith chart coverage, comprises the following steps:

1. The user defines the target reflection factor vector (GAMMA-target);
2. The best Smith chart coverage is determined by selecting and creating a calibration data subset comprising sets of reflection factor vectors at the test port (S11($\Phi, \Psi i$)) for all angular positions $\Phi$ of each probe and angular positions $\Psi i$ of arms "i", which carry the probes "i", with i=$\{1,2,3\}$ as follows:
3. $|\Psi 2-\Psi 1|\approx|\Psi 3-\Psi 2|\approx|\Psi 1-\Psi 3|\approx\lambda/(6*R)$, whereby $\lambda$ is the wavelength at frequency (F) and R the radius of the toroid center conductor.
4. A computer algorithm searches in the subset of calibration data of step 2) above for probe "i" angular positions $\Phi i$ for calibrated S11 vectors closest to GAMMA-target and saves the data points.
5. A secondary search algorithm then compares interpolated probe "i" angular positions $\Phi i.opt$ for S11 for S11 vectors closer to GAMMA-target, than in step 4) above and saves the new points.
6. The computer then instructs the motors to rotate the arms "i" to $\Psi i$ of step 3) and probes "i" to $\Phi i.opt$, whereby i=$\{1,2,3\}$.

It is obvious that, because of the electrical distance of the probes to each other, the $\Psi i$ values vary with the selected frequency, so for each frequency this configuration and search must be repeated.

This invention has been described in a basic preferred embodiment; obvious variances and configurations to the disclosed concept of automated circular multi-carriage slide screw impedance tuners using rotating carriages and disc probes, are possible but shall not impede on to the validity of the present invention.

What I claim as my invention is:

1. A multi-carriage electro-mechanical impedance tuner, comprising
    a test port, an idle port and a circular parallel plate airline (slabline) between the ports,
    and at least two independent mobile carriages carrying disc-shaped conductive tuning probes;
    whereby the slabline comprises
        a) two parallel conductive discs, a top disc and a bottom disc, having a common center, similar diameter and being separated by a space (channel) between them, and
        b) a center conductor having toroid form and being centered in the space between the two discs and having the same center as the discs;
    whereby the discs and the center conductor form a circular transmission airline (slabline) with characteristic impedance Zo;
    and whereby the tuning probes slide in, out and along the channel;
    and whereby the carriages are radial arms, controlled by a first stepper motor, rotate around the center of the discs and slide on top of the top disc;
    and whereby a second stepper motor is mounted at the peripheral end of each radial arm and controls the tuning probe,
    whereby the axis of the second motor is perpendicular to the slabline discs;
    and whereby the tuning probe is rotating eccentrically around its own rotation axis, and, in a planetary fashion, around the center of the slabline discs, hereby sliding along the channel of the slabline and penetrating into the channel at adjustable depth, the depth being controlled by the second motor;
    and whereby the motors are driven by a tuner controller using electronic control boards, digital communication and software.

2. Tuner as in claim 1, having three independent mobile carriages, radial arms, tuning probes and control.

3. Input and output coaxial ports for the slabline of claim 1, using coaxial connectors,
    said connectors having a center conductor and a grounded external cylindrical mantle, said center conductor forming a continuation of the circular center conductor of the slabline and being bent by approximately 90 degrees from its circular path towards the periphery of the discs,
and whereby the coaxial connectors are mounted perpendicular on the edge of the discs.

4. S-parameter interpolation method for each arm and associated disc-probe of tuner as in claim 1, using calibration data, as follows:
a) define the target values $(\Phi,\Psi)$;
b) determine the set of the 9 closest calibrated states to $(\Phi,\Psi)$ i.e. $(\Phi m,\Psi n)$, whereby $\{m,n\}=\{1,2,3\}$ and whereby $\Phi1<\Phi2<\Phi3$ and $\Psi1<\Psi2<\Psi3$ and $\Phi1<\Phi<\Phi3$ and $\Psi1<\Psi<\Psi3$;
c) calculate the reflection factor $Sij(\Phi,\Psi)$ using the following relations:

$$Sij(\Phi,\Psi k)=A(\Phi)*Sij(\Psi k,\Phi1)+B(\Phi)*Sij(\Psi k,\Phi2)+C(\Phi)*Sij(\Psi k,\Phi3),$$

$$Sij(\Phi,\Psi)=A(\Psi)*Sij(\Psi1,\Phi)+B(\Psi)*Sij(\Psi2,\Phi)+C(\Psi)*Sij(\Psi3,\Phi),$$

whereby $\{i,j\}=\{1,2\}$ and $k=\{1,2,3\}$;
and whereby the coefficients A, B and C are calculated using the following relations:

$$A(\Theta)=(\Theta-\Theta2)*(\Theta-\Theta3)/((\Theta1-\Theta2)*(\Theta1-\Theta3));$$

$$B(\Theta)=(\Theta-\Theta1)*(\Theta-\Theta3)/((\Theta2-\Theta1)*(\Theta2-\Theta3));$$

$$C(\Theta)=(\Theta-\Theta2)*(\Theta-\Theta1)/((\Theta3-\Theta2)*(\Theta3-\Theta1));$$

whereby $\Theta$ can be replaced in above equations by $\Phi$ or $\Psi$; $\Psi$ corresponding to the rotation angle of the mobile arm and $\Phi$ corresponding to the rotation angle of the disc-probe.

5. Calibration method for tuner as in claim 1 comprising the following steps:
a) connect the tuner to a pre-calibrated vector network analyzer (VNA) and initialize,
whereby rotating all mobile arms and disc-probes to initial angles, whereby the probes penetrate to a minimum into the slabline channel creating minimum reflection;
b) s-parameters of the initialized tuner are measured for all frequencies (Fn=N*Fo) of interest and saved in a matrix [S0(Fn)], whereby Fo is the fundamental frequency and N is an integer number, N≤3, equal to or smaller than the number of carriages;
c) scaling,
whereby the rotation angle $\Phi$, of each disc-probe individually, is changed progressively, in a number (M) of steps, inserting the probe into the slot of the slabline, while all other probes remain initialized, and
the reflection factor (S11) at the fundamental frequency Fo is measured at the tuner test port for each angular position $\Phi$, between minimum (S11min) and maximum (S11max) reflection factor and saved in memory; whereby the number of steps (M) is a number typically between 5 and 30;
d) calibration,
comprising a sequence of steps, as follows:
each individual probe is rotated to each angle position $\Phi$, defined in step c), while all other probes remain initialized,
whereby, for each position $\Phi$,
d1) the mobile arm associated with the selected probe is rotated to a number of rotation angles $(\Psi)$, from $(\Psi o)$ to $(\Psi max)$, whereby $(\Psi max-\Psi o)=\lambda/(2*\pi*R)$, R is the distance between the rotation axis of the arm and the center conductor, and $\lambda$ is the wavelength at the fundamental frequency (Fo), and
d2) tuner s-parameters are measured and retrieved from the VNA for all frequencies (Fn), and
d3) s-parameters of all probes, except of the probe closest to the test port, are cascaded with the inverse matrix $[S0(Fn)]^{-1}$ and saved;
e) saving,
whereby s-parameters of all frequencies (Fn), all probes and all probe $(\Phi)$ and arm $(\Psi)$ angle permutations of step d3) are generated numerically in computer memory and saved in a calibration file in a matrix format $[S(Fn,\Phi,\Psi)]$ for later use.

6. Multi-frequency impedance synthesis algorithm for tuners, which has been calibrated as in claim 5, uses interpolation data and comprises the following steps:
a) user definition of the target reflection factors (GAMMA-target(Fn)) at a number of frequencies (Fn=N*Fo), whereby N is an integer number smaller or equal to the number of tuner carriages, and retrieval of the calibration data;
b) numeric search for angles $\Phi c$ and $\Psi c$ of each arm and each probe through the calibration data of all frequencies (Fn) for the calibrated points (S11.c(Fn)), for which the Tuning Error (TE) of vector differences over all frequencies, typically defined as $TE=\Sigma\{W(Fn)*|S11.c(Fn)-GAMMA-target(Fn)|^2\}$, whereby W(Fn) is a weighing factor, is minimum;
c) alternative probe angle $\Phi$ and arm angle $\Psi$ search of each arm and each probe, of interpolated points S11.int (Fn), in the vicinity of the angles $(\Phi c, \Psi c)$, for S11.t (Fn) for which the tuning error (TE) as in step b) is minimum;
d) saving the angles $\Psi t$ and $\Phi t$ of each arm and each probe, corresponding to S11.t(Fn) in step c);
e) set each mobile arm to the angle $\Psi t$ and the associated probe to the angle $\Phi t$, found in step d).

7. Algorithm for mechanically stable impedance synthesis for tuners at selected frequency (F), which has been calibrated as in claim 5, using interpolation, comprising the following steps:
a) define the target reflection factor vector (GAMMA-target);
b) determine best Smith chart coverage
whereby creating a calibration data subset comprising sets of reflection factor vectors at the test port $(S11(\Phi, \Psi i))$ for angular positions $\Psi i$ of arms "i" carrying probes "i", wherein $i=\{1,2,3\}$ and $|\Psi2-\Psi1|\approx|\Psi3-\Psi2|\approx|\Psi1-\Psi3|\approx\lambda/(6*R)$, whereby $\lambda$ is the wavelength at frequency (F) and R the radius of the toroid center conductor;
c) search in calibration data subset of step b) for angular positions $\Phi i$ of probe "i", corresponding to calibrated S11 vectors closest to GAMMA-target and save;
d) search for optimum interpolated angles $\Phi i.opt$ of probe "i" corresponding to S11 vectors closer to GAMMA-target than in step c), and save;
e) repeat step d) until the vector difference between S11 and GAMMA-target is minimum, and save;
f) rotate arms "i" to $\Psi i$ and probes "i" to $\Phi i.opt$, determined in step e), whereby $i=\{1,2,3\}$.

8. Circular parallel plate airline (slabline) as in claim 1, having characteristic impedance Zo and total length of the toroid center conductor of at least N/2*λ,
- whereby λ is the wavelength at the lowest frequency of operation of the tuner and N is the number of carriages of the tuner.

9. Slabline as in claim 1 or 8, whereby the characteristic impedance Zo is equal to 50 Ohms.

10. Metallic disc-probes for tuners as in claim 1, having
- thickness matching the width of the channel of the slabline;
- and concave channel (groove) carved out of the disc-probe periphery, parallel to the disc-probe surface,
- whereby the groove diameter matches approximately the diameter of the center conductor of the slabline;
- and wherein the rotation axis of the probe is perpendicular to the center conductor and eccentric, relative to the geometric center of the probe.

11. Disc-probes as in claim 10, having oval shape.

12. Disc-probes as in claim 10, having elliptical shape.

13. Disc-probes as in claim 11 or 12 having rotation axis approximately equal to geometrical center.

\* \* \* \* \*